United States Patent
Tracy et al.

(10) Patent No.: US 7,803,206 B2
(45) Date of Patent: Sep. 28, 2010

(54) ELECTRONIC DEVICE FILTER ASSEMBLY

(75) Inventors: Mark S. Tracy, Tomball, TX (US); Earl W. Moore, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 440 days.

(21) Appl. No.: 11/881,246

(22) Filed: Jul. 26, 2007

(65) Prior Publication Data

US 2009/0025558 A1 Jan. 29, 2009

(51) Int. Cl.
*B01D 46/00* (2006.01)

(52) U.S. Cl. .................... 55/385.6; 55/481; 55/506; 361/690

(58) Field of Classification Search ............ 55/385.6, 55/493, 501, 508, 467, 496, 385.4, 506, 481; 454/184, 192; 361/685, 684, 687, 688, 690; 604/333
See application file for complete search history.

(56) References Cited

U.S. PATENT DOCUMENTS

| | | | | |
|---|---|---|---|---|
| 4,449,970 A | * | 5/1984 | Bevan et al. | 604/333 |
| 5,074,851 A | * | 12/1991 | Plass et al. | 604/333 |
| 5,163,870 A | * | 11/1992 | Cooper | 454/184 |
| 5,370,638 A | * | 12/1994 | Keyes | 604/333 |
| 5,626,569 A | * | 5/1997 | Holtermann et al. | 604/333 |
| 5,766,285 A | * | 6/1998 | Killman | 55/385.6 |
| 6,284,010 B1 | * | 9/2001 | Rehmert | 55/385.6 |
| 6,297,950 B1 | * | 10/2001 | Erwin | 361/679.49 |
| 6,355,078 B1 | * | 3/2002 | Wickland | 55/385.4 |
| 6,552,900 B1 | * | 4/2003 | Hoefer et al. | 361/695 |
| 6,648,947 B2 | * | 11/2003 | Paydar et al. | 95/278 |
| 2008/0236393 A1 | * | 10/2008 | Heller et al. | 95/273 |

\* cited by examiner

*Primary Examiner*—Duane Smith
*Assistant Examiner*—Minh-Chau Pham

(57) ABSTRACT

A filter assembly includes a sleeve coupled to an external surface of an electronic device and disposed at least partially over an airflow vent of the electronic device, the sleeve configured to receive insertion of a filter element therein.

20 Claims, 3 Drawing Sheets

ELECTRONIC DEVICE FILTER ASSEMBLY

BACKGROUND

Electronic devices, such as notebook computers, personal digital assistants, gaming devices, etc., have airflow vents that enable an airflow to pass through the electronic device to dissipate thermal energy generated by the electronic device. However, the airflow passing through the electronic device can contain dust and other contaminants that may damage and/or otherwise impede the operation and/or performance of the electronic device.

DETAILED DESCRIPTION OF THE DRAWINGS

Figure 1:
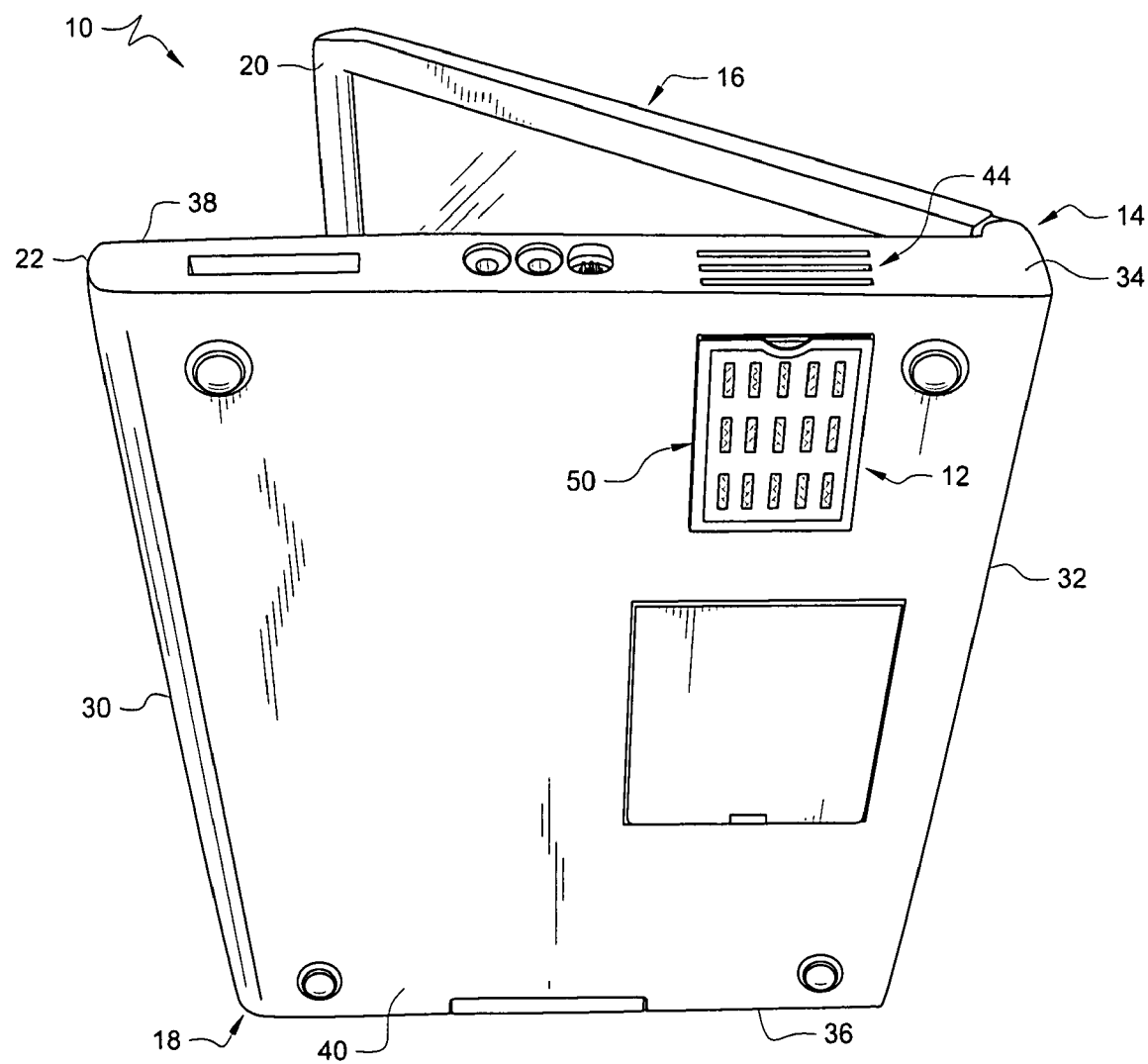
FIG. 1 is a diagram illustrating an electronic device in which an embodiment of a filter assembly is employed to advantage.

FIG. 1 is a diagram illustrating an electronic device 10 in which an embodiment of a filter assembly 12 is employed to advantage. In the embodiment illustrated in FIG. 1, electronic device 10 comprises a notebook or laptop computer 14 having a display member 16 rotatably coupled to a base member 18. However, it should be understood that filter assembly 12 may be incorporated and/or otherwise used with other types of electronic devices 10 such as, but not limited to, a personal digital assistant, a tablet computer, a desktop computer, and a gaming device. In the embodiment illustrated in FIG. 1, display member 16 and base member 18 each comprise a housing 20 and 22, respectively. Each of housings 20 and 22 generally comprises various walls located on various edges, sides and/or surfaces thereof. For example, in the embodiment illustrated in FIG. 1, housing 22 comprises a front wall 30, a rear wall 32, oppositely disposed side walls 34 and 36, an upper wall or working surface 38, and a bottom wall 40. In the embodiment illustrated in FIG. 1, filter assembly 12 is illustrated as being disposed on bottom wall 40. However, it should be understood that the location of filter assembly 12 on device 10 may be varied. Further, in FIG. 1, a single filter assembly 12 is illustrated; however, it should be understood that additional filter assemblies 12 may be used on a single electronic device 10.

Figure 2A:
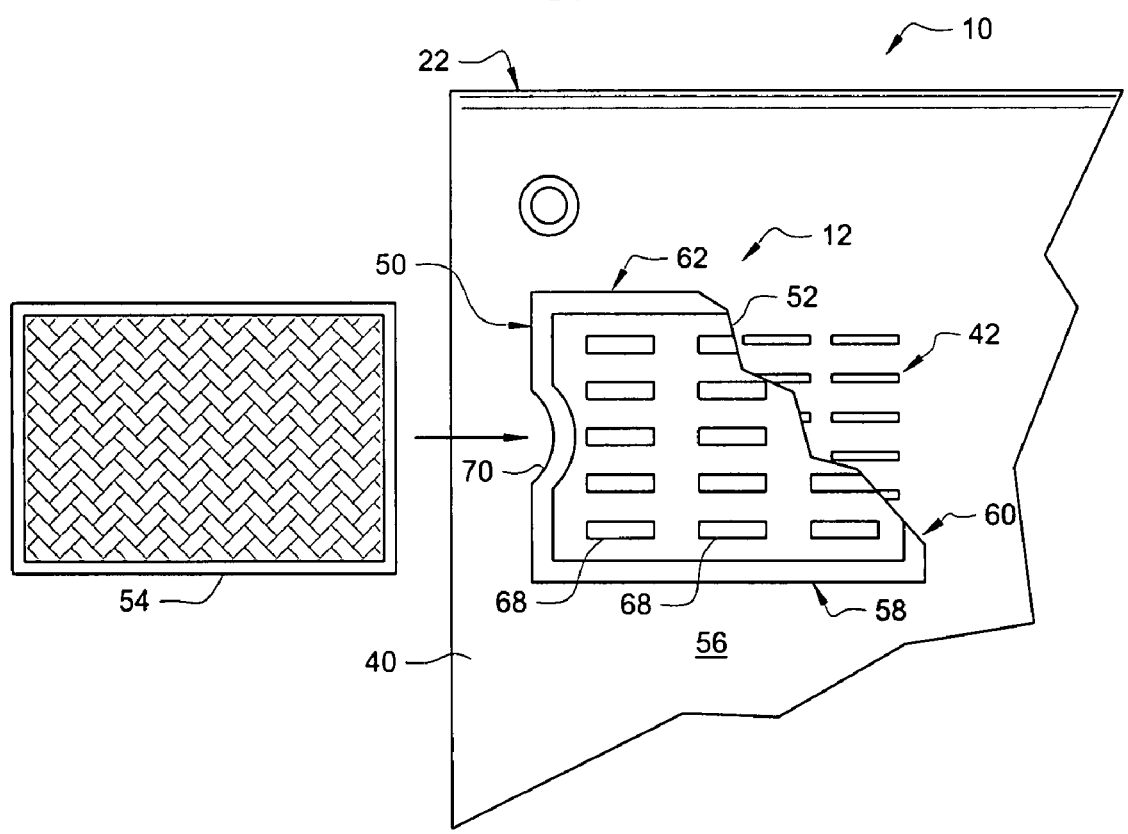
FIG. 2A is a diagram illustrating a bottom view of the filter assembly of FIG. 1 with a filter element removed therefrom.
Figure 2B:
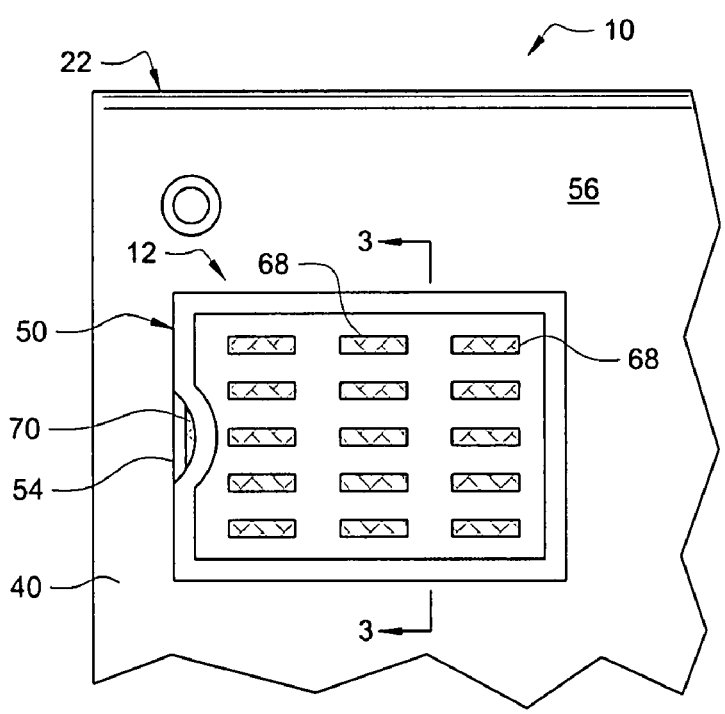
FIG. 2B is a diagram illustrating a bottom view of the filter assembly of FIGS. 1 and 2A with a filter element installed therein.
Figure 3:
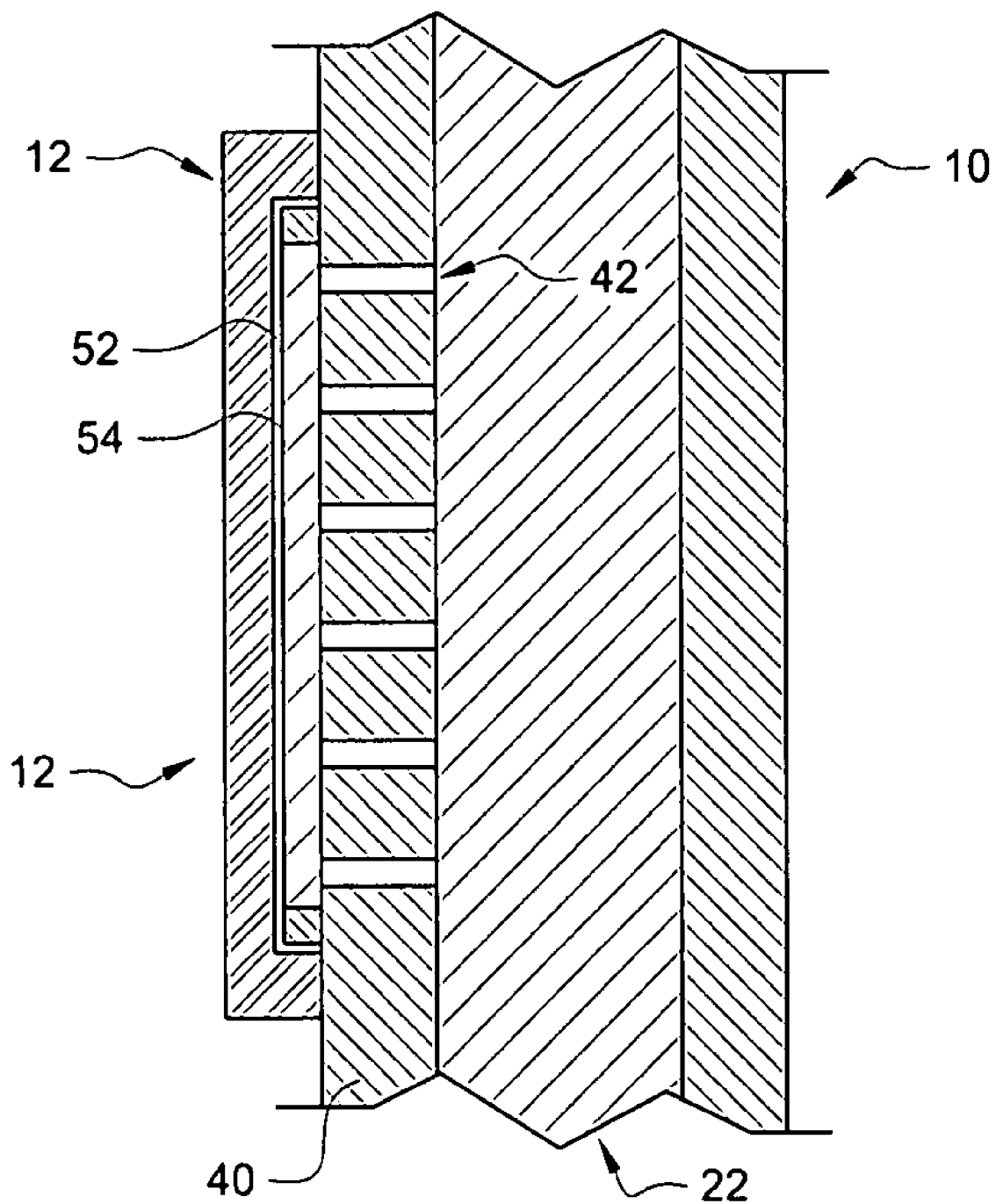
FIG. 3 is a diagram illustrating a section view of the filter assembly of FIG. 2B taken along the line 3-3 of FIG. 2B.

FIGS. 2A and 2B are diagrams illustrating a bottom view of filter assembly 12 of FIG. 1, and FIG. 3 is a diagram illustrating a section view of filter assembly 12 of FIG. 2B taken along the line 3-3 of FIG. 2B. Referring to FIGS. 1-3, electronic device 10 comprises airflow vents 42 and 44 to facilitate an airflow through housing 22 to dissipate thermal energy from within housing 22. In the embodiment illustrated in FIGS. 1-3, airflow vent 42 comprises an intake airflow vent 42 located on bottom wall 40 of housing 22, and airflow vent 44 comprises an exhaust airflow vent 44 located on side wall 34 of housing 22. However, it should be understood that airflow vents 42 and 44 may be otherwise located on electronic device 10 and, further, the direction of airflow through airflow vents 42 and 44 may be otherwise configured. In the embodiment illustrated in FIGS. 1-3, filter assembly 12 is disposed at least partially over intake airflow vent 42 to facilitate filtering of an airflow passing therethrough prior to such airflow entering housing 22. The airflow passing through housing 22 may be generated and/or otherwise caused by a fan located within housing 22, convective cooling or otherwise.

In the embodiment illustrated in FIGS. 1-3, filter assembly 12 comprises a sleeve 50 disposed over at least a portion of intake airflow vent 42 and configured to receive a filter element 54 therein. For example, in the illustrated embodiment, sleeve 50 is fixedly coupled to bottom wall 40 such that sleeve 50 extends around at least a portion of a periphery of intake airflow vent 42. In FIG. 2A, a portion of sleeve 50 is illustrated as broken away to reveal intake airflow vent 42 thereebeneath. In operation, sleeve 50 is configured and/or otherwise coupled to bottom wall 40 of housing 22 to form a pocket 52 for receiving filter element 54 therein. In FIG. 2A, filter element 54 is illustrated outside of pocket 52 and, in FIG. 2B, filter element 54 is illustrated within pocket 52. In some embodiments, sleeve 50 comprises a single layer of material coupled to a surface 56 of bottom wall 40 along three sides 58, 60 and 62 of intake airflow vent 42 to form pocket 52 between sleeve 50 and surface 56 of bottom wall 40. However, it should be understood that sleeve 50 may be otherwise configured to form pocket 52 (e.g., sleeve 50 may be configured using two layers of material having a space therebetween to form a pocket therebetween without relying on a surface of housing 22 to form one side of pocket 52). Thus, it should be understood that a variety of different methods may be used to form sleeve 50 and/or pocket 52.

In some embodiments, sleeve 50 is configured as an air-permeable sleeve 50 to enable an airflow to pass therethrough and into intake airflow vent 42. For example, in some embodiments, sleeve 50 may be formed from an air-permeable film. In some embodiments, sleeve 50 may be formed from an air-impermeable material (e.g., Mylar or another type of plastic) having perforations formed therein. For example, in the embodiment illustrated in FIGS. 1-3, sleeve 50 comprises apertures 68 formed therethrough in a spaced-apart relationship relative to each other to facilitate an airflow through sleeve 50 and into intake airflow vent 42. Thus, it should be understood that a variety of different materials may be used to form sleeve 50.

In some embodiments, sleeve 50 is fixedly coupled to surface 56 of bottom wall 40. For example, in some embodiments, portions of sleeve 50 disposed about at least a portion of a periphery of intake airflow vent 42 are bonded to bottom surface 56 using an adhesive, resin, or other adherent. However, it should be understood that other devices or methods may be used to fixedly attached sleeve 50 to housing 22. Filter element 54 may comprise any type of filter medium for filtering an airflow before the airflow enters intake airflow vent 42. Filter element 54 is generally sized to fit within pocket 52 of sleeve 50 such that at least a portion of filter element 54 is disposed over and/or otherwise covers at least a portion of intake airflow vent 42. In some embodiments, sleeve 50 is configured to receive slidable insertion of filter element 54 into pocket 52. However, it should be understood that sleeve 50 may be otherwise configured for receiving insertion and removal of filter element 54 between at least a portion of sleeve 50 and intake airflow vent 42.

In the embodiment illustrated in FIGS. 1-3, sleeve 50 is configured having a cut-out portion 70 disposed along a periphery thereof to facilitate removal of filter element 54 from pocket 52. For example, referring to FIG. 2B, filter element 54 is illustrated as being disposed within pocket 52 formed by sleeve 50. In some embodiments, sleeve 50, cut-out portion 70 and/or filter element 54 are configured such that at least a portion of filter element 54 extends beyond cut-out portion 70 to expose at least a portion of filter element 54, thereby enabling contact of at least a portion of filter element 54 by a user of electronic device 10 to facilitate withdrawal and/or extraction of filter element 54 from pocket 52 of sleeve 50. Thus, embodiments of filter assembly 12 facilitate ready removal and/or replacement of filter element 54. Thus, in some embodiments, sleeve 50 forms a picture frame-shaped pocket 52 around intake airflow vent 42 having one side open for receiving insertion and extraction of filter element 54 relative thereto. In FIG. 3, the locations, sizes and/or spacing of sleeve 50 and filter element 54 are illustrated in a manner to better describe the relationships of the various components of filter assembly 12 (e.g., it should be understood that filter element 54 is likely to be in contact with surface 56 of bottom wall 22 and an interior surface of sleeve 50).

In some embodiments, filter assembly 12 is manufactured by coupling sleeve 50 to an external surface of electronic device 10 and disposed at least partially over an airflow vent 42 and/or 44 of the electronic device where sleeve 50 is configured to receive insertion of filter element 54 therein. In some embodiments, sleeve 50 is manufactured as a perforated sleeve 50. In some embodiments, sleeve 50 is manufactured having cut-out portion 70 to facilitate removal of filter element 54 disposed within sleeve 50. In some embodiments, filter assembly 12 is manufactured by configuring sleeve 50 to form pocket 52 for receiving filter element 54 between at least a portion of sleeve 50 and an airflow vent 42 and/or 44. In some embodiments, filter assembly 12 is manufactured by bonding sleeve 50 to the external surface of electronic device 10.

Thus, embodiments of filter assembly 12 enable a filter (e.g., filter element 54) to be easily removed and replaced and/or cleaned to facilitate a satisfactory level of airflow through electronic device 10 while also preventing dust, debris or other undesirable matter from entering electronic device 10.

What is claimed is:

1. A filter assembly, comprising: a sleeve coupled to an external surface of an electronic device and disposed at least partially over an airflow vent of the electronic device, wherein the sleeve comprises an air-permeable film and is configured to receive insertion of a filter element therein.

2. The filter assembly of claim 1, wherein the sleeve comprises a perforated sleeve.

3. The filter assembly of claim 1, wherein the sleeve is bonded to the external surface of the electronic device.

4. The filter assembly of claim 1, wherein the sleeve forms a pocket for receiving the filter element between at least a portion of the sleeve and the airflow vent.

5. The filter assembly of claim 1, wherein the sleeve is coupled to the surface of the electronic device around at least a portion of a periphery of the airflow vent.

6. The filter assembly of claim 1, wherein at least a portion of the filter element is locatable over at least a portion of the airflow vent when the filter element is disposed within the sleeve.

7. The filter assembly of claim 1, wherein the sleeve is configured to enable slidable insertion of the filter element therein.

8. The filter assembly of claim 1, wherein the sleeve comprises a cut-out portion to facilitate removal of a filter element disposed within the sleeve and wherein the filter element extends beyond the cut-out portion.

9. The filter assembly of claim 1, wherein the filter element comprises a replaceable filter element.

10. A filter assembly, comprising: an air-permeable sleeve fixedly coupled to a housing of an electronic device and disposed at least partially over an airflow vent of the electronic device, wherein the air-permeable sleeve comprises an air-permeable film and is configured to receive a removable filter element therein.

11. The filter assembly of claim 10, wherein the air-permeable sleeve is bonded to the housing of the electronic device.

12. The filter assembly of claim 10, wherein the air-permeable sleeve forms a pocket for receiving the filter element between at least a portion of the air-permeable sleeve and the airflow vent.

13. The filter assembly of claim 10, wherein the air-permeable sleeve is coupled to the housing of the electronic device around at least a portion of a periphery of the airflow vent.

14. The filter assembly of claim 10, wherein the air-permeable sleeve is configured to enable slidable insertion of the filter element therein.

15. The filter assembly of claim 10, wherein the air-permeable sleeve comprises a cut-out portion to facilitate removal of a filter element disposed within the sleeve and wherein the filter element extends beyond the cut-out portion.

16. A method for manufacturing a filter assembly, comprising: coupling a sleeve to an external surface of an electronic device and disposed at least partially over an airflow vent of the electronic device, wherein the sleeve comprises an air-permeable film and is configured to receive insertion of a filter element therein.

17. The method of claim 16, further comprising configuring the sleeve as a perforated sleeve.

18. The method of claim 16, further comprising configuring the sleeve having a cut-out portion to facilitate removal of a filter element disposed within the sleeve and extending the filter element beyond the cut-out portion.

19. The method of claim 16, further comprising configuring the sleeve to form a pocket for receiving the filter element between at least a portion of the sleeve and the airflow vent.

20. The method of claim 16, further comprising bonding the sleeve to the external surface of the electronic device.

* * * * *